(12) United States Patent
Li et al.

(10) Patent No.: US 12,312,684 B2
(45) Date of Patent: May 27, 2025

(54) SILOXANE COMPOSITIONS AND METHODS FOR USING THE COMPOSITIONS TO DEPOSIT SILICON CONTAINING FILMS

(71) Applicant: Versum Materials US, LLC, Tempe, AZ (US)

(72) Inventors: Jianheng Li, Tempe, AZ (US); Xinjian Lei, Tempe, AZ (US); Raymond N. Vrtis, Tempe, AZ (US); Robert G. Ridgeway, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 384 days.

(21) Appl. No.: 16/442,511

(22) Filed: Jun. 16, 2019

(65) Prior Publication Data

US 2019/0382886 A1    Dec. 19, 2019

Related U.S. Application Data

(60) Provisional application No. 62/685,867, filed on Jun. 15, 2018.

(51) Int. Cl.
*C23C 16/40* (2006.01)
*C07F 7/08* (2006.01)
*C23C 16/511* (2006.01)

(52) U.S. Cl.
CPC .......... *C23C 16/401* (2013.01); *C07F 7/0838* (2013.01); *C23C 16/511* (2013.01)

(58) Field of Classification Search
None
See application file for complete search history.

(56) References Cited

U.S. PATENT DOCUMENTS

| | | | | |
|---|---|---|---|---|
| 6,235,864 B1* | 5/2001 | Loy | ........................ | C08G 77/50 528/37 |
| 7,998,536 B2* | 8/2011 | Yim | ........................ | C23C 16/56 427/532 |
| 8,952,118 B2* | 2/2015 | Arkles | ..................... | C08G 77/08 524/588 |
| 2001/0023305 A1* | 9/2001 | Schwindeman | .......... | C07F 1/02 540/484 |
| 2002/0072220 A1 | 6/2002 | Wang et al. | | |
| 2004/0166692 A1* | 8/2004 | Loboda | .................... | C23C 16/30 438/783 |
| 2006/0134441 A1* | 6/2006 | Mah | ................... | H01L 21/31695 428/447 |
| 2007/0173071 A1 | 7/2007 | Afzali-Ardakani et al. | | |
| 2008/0274627 A1* | 11/2008 | Hamada | ............. | H01L 21/31633 257/E21.24 |
| 2009/0017231 A1 | 1/2009 | Yim et al. | | |
| 2010/0009546 A1* | 1/2010 | Weigel | .................. | H01L 21/316 106/287.11 |
| 2010/0022792 A1* | 1/2010 | Shen | ..................... | C07F 7/0807 556/431 |
| 2010/0052114 A1* | 3/2010 | Hara | .................. | H01L 21/02216 257/632 |
| 2011/0018108 A1* | 1/2011 | Kohmura | .......... | H01L 21/02282 257/632 |
| 2012/0029157 A1* | 2/2012 | Kim | ....................... | H10F 19/804 525/477 |
| 2013/0207245 A1* | 8/2013 | Inoue | .................. | H01L 21/7682 257/632 |
| 2014/0073144 A1* | 3/2014 | Chatterjee | ......... | H01L 21/02167 438/778 |
| 2014/0302688 A1* | 10/2014 | Underwood | .......... | C23C 16/401 438/786 |
| 2014/0302690 A1 | 10/2014 | Underwood et al. | | |
| 2014/0319575 A1* | 10/2014 | Choi | ....................... | C08G 77/20 556/450 |
| 2015/0364321 A1 | 12/2015 | Vrtis et al. | | |
| 2016/0333008 A1* | 11/2016 | Sun | ........................ | A61P 35/00 |
| 2017/0114465 A1 | 4/2017 | Kalutarage et al. | | |

(Continued)

FOREIGN PATENT DOCUMENTS

| | | | | |
|---|---|---|---|---|
| WO | 2008-033980 | | 3/2008 | |
| WO | WO 2016/065219 A1 | * | 4/2016 | ............. C23C 16/40 |
| WO | 2018-053129 | | 3/2018 | |

OTHER PUBLICATIONS

Brown, Hayley A., et al., "Zwitterionic Polymerization to Generate High Molecular Weight Cyclic Poly(Carbosiloxane)s". Journal of the American Chemical Society, 2013, 135, 18738-18741.*
Chen, Zhen, et al., "Recent progress in surface coating of layered LiNixCoyMnzO2 for lithium-ion batteries". Materials Research Bulletin 96 (2017) 491-502.*
Naumann, Stefan, et al., "N-Heterocyclic carbenes as organocatalysts for polymerizations: trends and frontiers." Polymer Chemistry, 2015, 6, 3185-3200.*

(Continued)

*Primary Examiner* — Bret P Chen
(74) *Attorney, Agent, or Firm* — Daniel Roth; Versum Materials US, LLC

(57) ABSTRACT

The siloxanes containing compositions and methods are disclosed. The disclosed method relates to a method of depositing a dielectric film on a substrate, the method involving the steps of a) placing the substrate in a reaction chamber; b) introducing a process gas comprising a cyclic silicon-containing compound and an oxidant; and c) exposing the substrate to the process gas under conditions such that the cyclic silicon-containing compound and the oxidant react to form a flowable film on the substrate surface. The method can further involve converting the flowable film into a solid dielectric material (e.g., a silicon oxide film). In certain embodiments, conversion of the film may be accomplished by annealing the as-deposited film by a thermal, plasma anneal and/UV curing.

10 Claims, 4 Drawing Sheets

(56) References Cited

U.S. PATENT DOCUMENTS

2018/0025907 A1 1/2018 Kalutarage et al.
2018/0122632 A1 5/2018 Vrtis et al.

OTHER PUBLICATIONS

Velankar, Sachin, et al., "High-Performance UV-Curable Urethane Acrylates via Deblocking Chemistry". Journal of Appled Polymer Science, vol. 62, (1996) 1361-1376.*

Dibandjo, P., et al., "Influence of the polymer architecture on the high temperature behavior of SiCO glasses: A comparison between linear- and cyclic-derived precursors". Journal of Non-Crystalline Solids 356 (2010) 132-140.*

Shimojima, Atsushi, et al., "Designed Synthesis of Nanostructured Siloxane-Organic Hybrids from Amphiphilic Silicon-Based Precursors". The Chemical Record, vol. 6, 53-63 (2006).*

\* cited by examiner

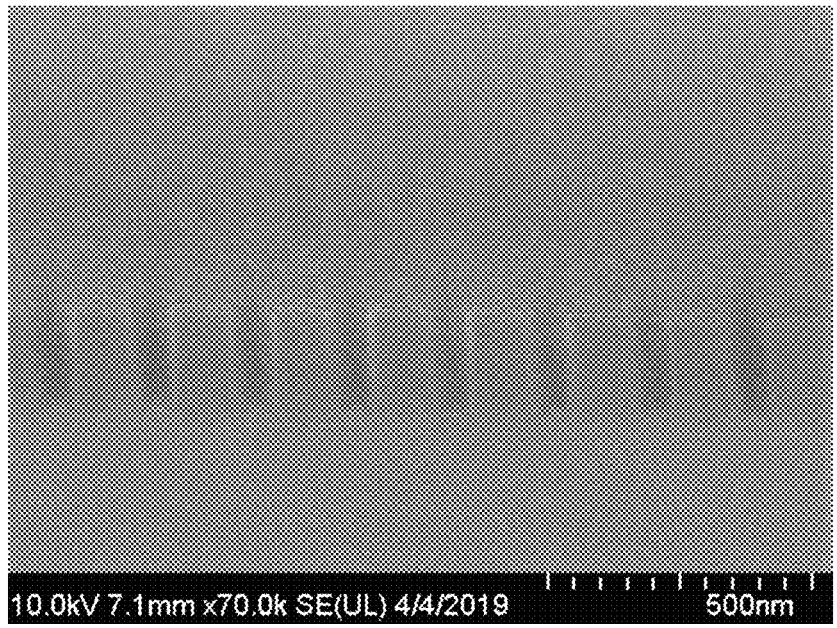
Figure 1. SEM image of the flowable OSG film after thermal annealing
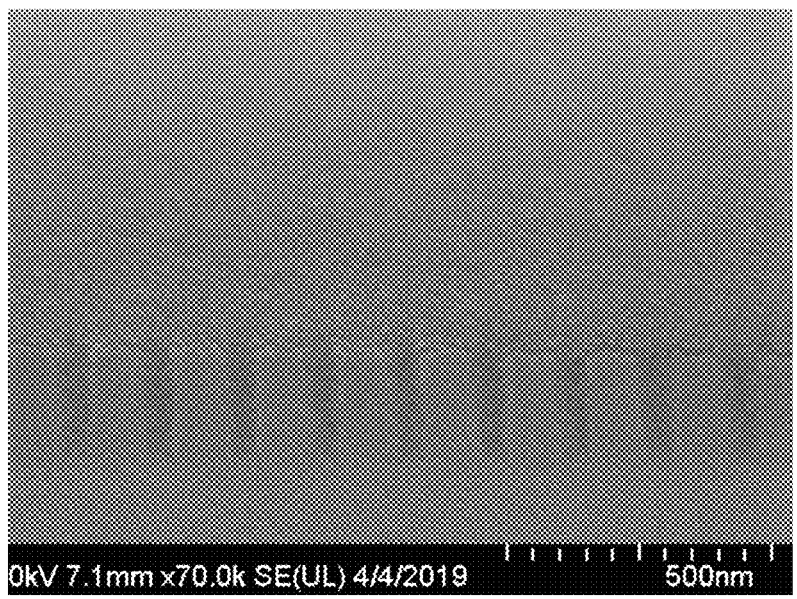
Figure 2. SEM image of the flowable OSG film after thermal annealing and UV curing

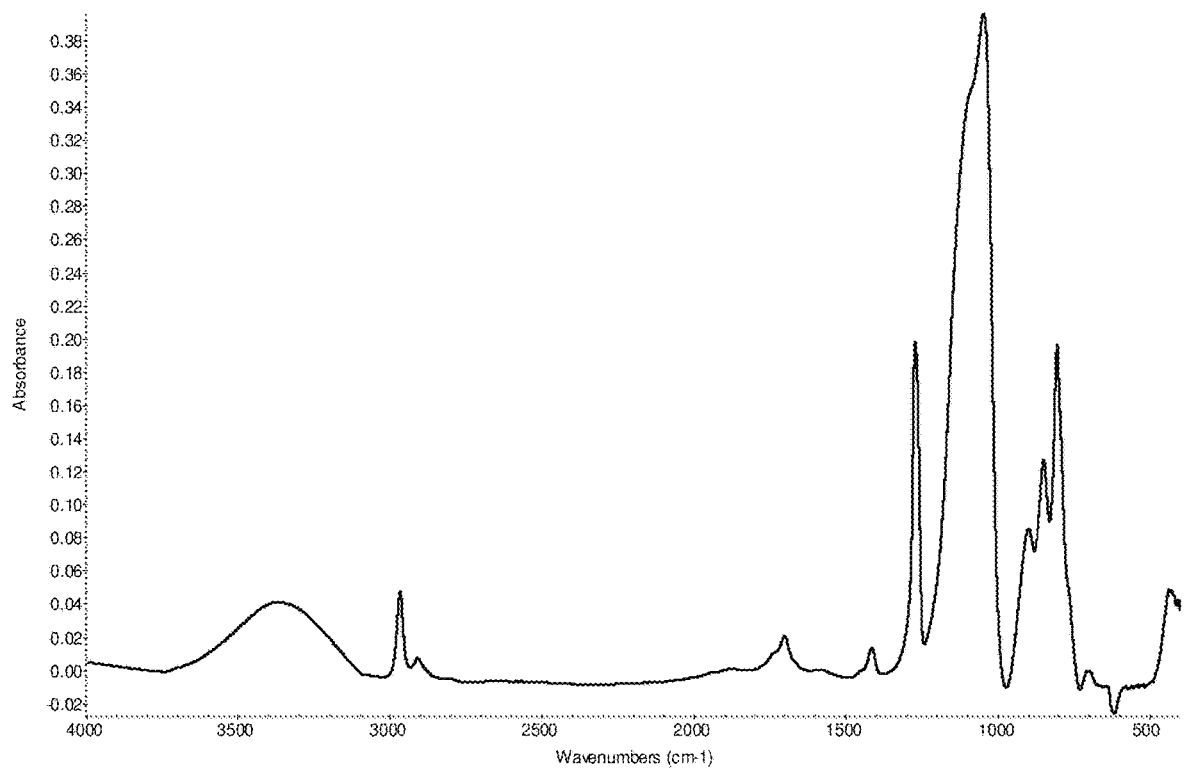
Figure 3. FTIR spectra for the as-deposited film

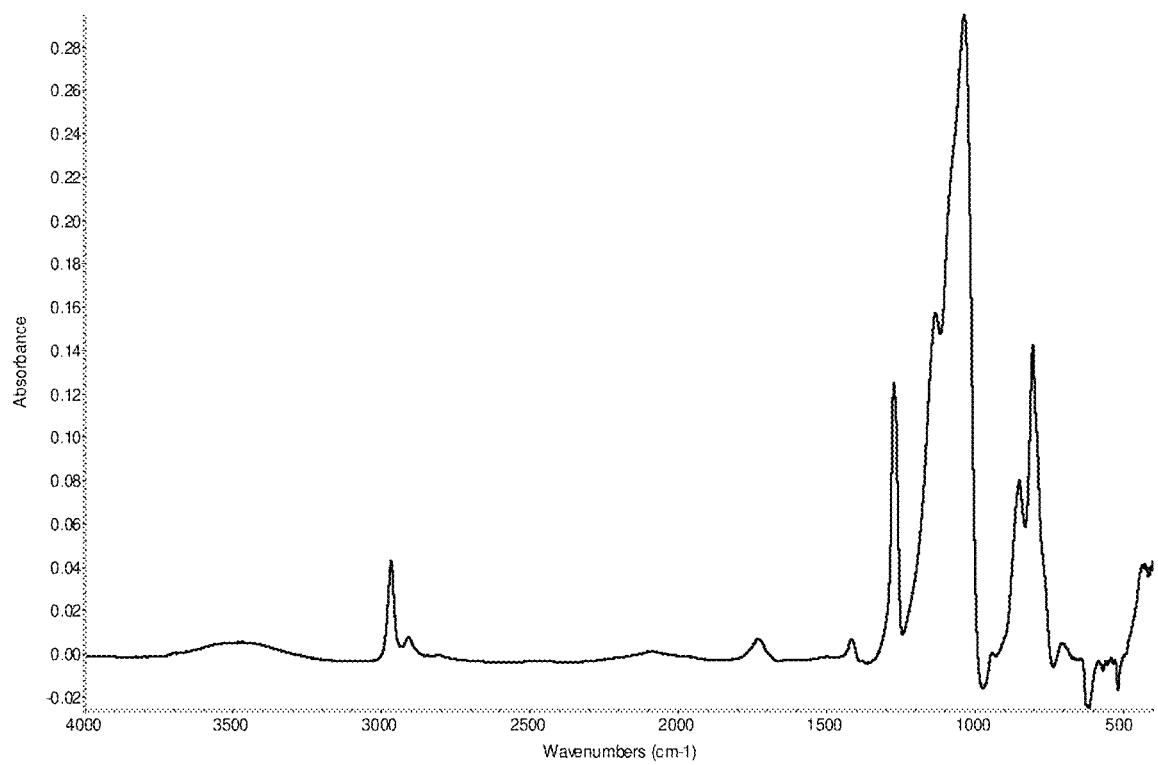
Figure 4. FTIR spectra for the film after thermal anneal.

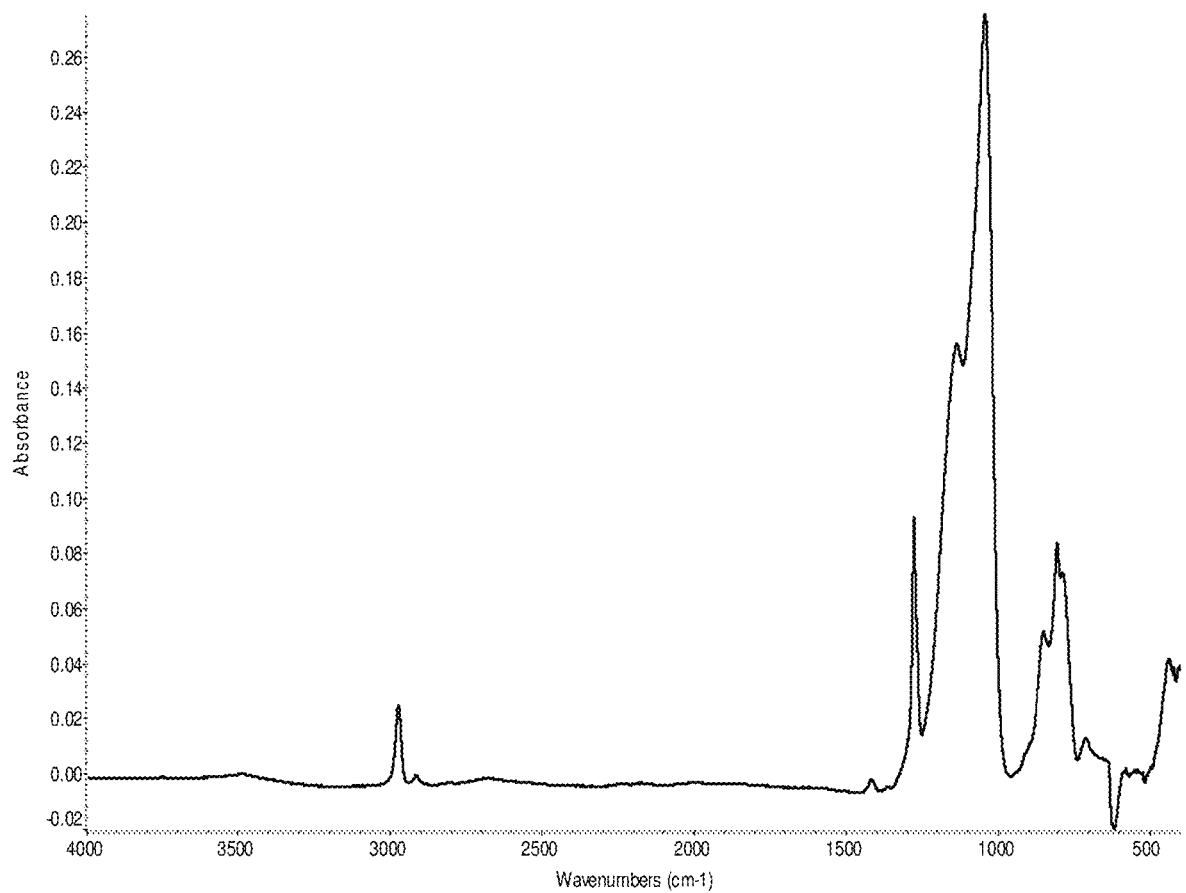
Figure 5. FTIR spectra for the film after thermal anneal and UV cure.

SILOXANE COMPOSITIONS AND METHODS FOR USING THE COMPOSITIONS TO DEPOSIT SILICON CONTAINING FILMS

CROSS-REFERENCE TO RELATED APPLICATIONS

This application claims the benefit of priority under 35 U.S.C. § 119(e) to earlier filed U.S. patent application Ser. No. 62/685,867, filed Jun. 15, 2018, the disclosure of which is incorporated herein by reference in its entirety.

BACKGROUND OF THE INVENTION

It is known in the art to deposit a silicon oxide film using flowable chemical vapor deposition processes with gas phase polymerization. For example, the prior art has focused on using compounds such as trisilylamine (TSA) to deposit Si, H, N containing oligomers that are subsequently oxidized to SiOx films using ozone exposure. Examples of such are disclosed in: U.S. Publ. No. 2014/0073144; U. S. Publ. No. 2013/230987; U.S. Pat. Nos. 7,521,378, 7,557,420, and 8,575,040; and 7,825,040. These processes always require high temperature water steam treatment and >1000° C. thermal annealing.

U.S. Pat. No. 7,825,038 B2 disclosed methods of depositing a silicon oxide layer on a substrate include the steps of providing a substrate to a deposition chamber, generating an atomic oxygen precursor outside the deposition chamber, and introducing the atomic oxygen precursor into the chamber. The deposition may also include introducing a silicon precursor to the deposition chamber, where the silicon precursor and the atomic oxygen precursor are first mixed in the chamber. Precursors such as octamethyltrisiloxane (OMTS), octamethylcyclotetrasiloxane (OMCTS), and tetramethylcyclotetrasiloxane (TOMCATS) were applied for this application.

U.S. Pat. Nos. 7,998,536, 7,989,033 and Yim, K. S. (2009) "Novel silicon precursors to make ultra low-k films with high mechanical properties by plasma enhanced chemical vapor deposition", disclose precursors and processes for forming low-k, Si—C, containing films.

U.S. Pat. No. 9,362,107 B2 disclosed method of forming a flowable low-k dielectric film on a patterned substrate. The film may be a silicon-carbon-oxygen (Si—C—O) layer in which the silicon and carbon constituents come from a silicon and carbon containing precursor while the oxygen may come from an oxygen-containing precursor activated in a remote plasma region. Shortly after deposition, the silicon-carbon-oxygen layer is treated by exposure to a hydrogen-and-nitrogen-containing precursor such as ammonia prior to curing. The treatment may remove residual moisture from the silicon-carbon-oxygen layer and may make the lattice more resilient during curing and subsequent processing. The treatment may reduce shrinkage of the silicon-carbon-oxygen layer during subsequent processing. Precursors such as octamethylcyclotetrasiloxane (OMCTS) and tetramethylcyclotetrasiloxane (TOMCATS) were claimed for this application.

The known precursors and deposition processes can deposit hydrophilic films which absorb moisture and lead to dielectric constant increase.

The disclosure of the previously identified patents and patent applications is hereby incorporated by reference.

SUMMARY OF THE INVENTION

The present invention solves problems associated with known precursors and processes by providing cyclic siloxane compositions and methods for depositing silicon containing films and in one embodiment, films to fill gaps between various features of a semiconductor.

More particularly, the present invention includes a flowable chemical vapor deposition method for forming a silicon containing film upon a substrate. The method includes placing the substrate into a reaction chamber and introducing at least one cyclic siloxane compound represented by Formula I

Formula I wherein $R^{1-4}$ are independently selected from hydrogen, a linear or branched $C_1$ to $C_{10}$ alkyl group, a linear or branched $C_3$ to $C_{10}$ alkenyl group, a linear or branched $C_3$ to $C_{10}$ alkynyl group, a di-$C_1$ to $C_6$-alkylamino group, and a $C_6$ to $C_{10}$ aryl group, and n=1, 2, 3, 4, and at least one activated species into the chamber. The reactor conditions are controlled so the silicon-containing compound and the activated species are made to react and condense onto the substrate as a flowable film. The at least one activated species is remotely activated with respect to the reaction chamber.

The flowable film in some instances has at least one of Si—C and Si—O bonds. The flowable film fills high aspect ratio gaps on the substrate surface features. The flowable film is then converted into a final silicon oxide film, for example by plasma, UV and/or thermal annealing. The methods of this invention may be used to fill high aspect ratio gaps, including gaps having aspect ratios ranging from 3:1 to 10:1 or larger.

The activated species may be generated using a remote plasma source, a remote microwave source, or a remote hot-wire system.

According to one embodiment, the at least one activated species is an oxidant generated by action of a plasma source or a remote microwave source upon a species selected from the group consisting of water vapor, ozone, oxygen, oxygen/helium, oxygen/argon, nitrogen oxides, carbon dioxide, hydrogen peroxide, organic peroxides, and mixtures thereof.

According to another embodiment, the at least one activated species is generated by action of a plasma source or a remote microwave source upon a species selected from nitrogen, a mixture of nitrogen and helium, a mixture of nitrogen and argon, ammonia, a mixture of ammonia and helium, a mixture of ammonia and argon, helium, argon, hydrogen, a mixture of hydrogen and helium, a mixture of hydrogen and argon, a mixture of ammonia and hydrogen, organic amine, and mixtures thereof.

According to another embodiment, the at least one cyclic siloxane compound comprises one or both of 2,2,5,5-tetramethyl-1-oxa-2,5-disilacyclopentane and 2,2,6,6-tetramethyl-1-oxa-2,6-disilacyclohexane.

After the above step is performed, the flowable film may be treated with a treatment selected from the group consisting of plasma, UV radiation and thermal annealing. Treating the flowable film with the treatment converts the flowable film to a dielectric material.

As mentioned previously, some embodiments of the invention relate to using the above method of forming a dielectric film for the purpose of filling gaps on a substrate with the dielectric. In such embodiments the silicon-containing compound and the oxidant react to form a flowable film in the gaps prior to converting the flowable film to a dielectric material.

In yet further embodiments, the silicon-containing film is deposited into the gaps via a plasma-assisted reaction. In such embodiments, an oxidant is introducing into the reaction chamber following the plasma-assisted reaction and deposition of the silicon-containing film into the gaps, and the silicon-containing film is exposed to the oxidant such that a flowable film comprising at least one of Si—O and Si—C bonds is formed in the gaps. The as-deposited film is then converted to a dielectric material.

Another aspect of the invention relates to a film obtained by the inventive method.

Another embodiment is directed to a composition for flowable chemical vapor deposition of a film onto a substrate, the composition including 2,2,5,5-tetramethyl-1-oxa-2,5-disilacyclopentane and having less than 10 ppm of halide ion impurities, the halide ions being selected from the group consisting of chlorides, fluorides, bromides, and iodides.

Another embodiment is directed to a composition for flowable chemical vapor deposition of a film onto a substrate, the composition including 2,2,5,5-tetramethyl-1-oxa-2,5-disilacyclopentane and having less than 10 ppm of metal ion impurities, the metal ions being selected from the group consisting of $Al^{3+}$, $Fe^{2+}$, $Fe^{3+}$, $Ni^{2+}$, and $Cr^{3+}$.

Another embodiment is directed to a composition for flowable chemical vapor deposition of a film onto a substrate, the composition including 2,2,6,6-tetramethyl-1-oxa-2,6-disilacyclohexane and having less than 10 ppm of halide ion impurities, the halide ions being selected from the group consisting of chlorides, fluorides, bromides, and iodides.

Another embodiment is directed to a composition for flowable chemical vapor deposition of a film onto a substrate, the composition including 2,2,6,6-tetramethyl-1-oxa-2,6-disilacyclohexane and having less than 10 ppm of metal ion impurities, the metal ions being selected from the group consisting of $Al^{3+}$, $Fe^{2+}$, $Fe^{3+}$, $Ni^{2+}$, and $Cr^{3+}$.

The various aspect of the invention can be used alone or in combinations with each other.

BRIEF DESCRIPTION OF THE DRAWINGS

FIG. 1 is an SEM photograph of a patterned wafer having an organosilicate glass film after thermal annealing as deposited in accordance with Example 1;

FIG. 2 is an SEM photograph of the patterned wafer depicted in FIG. 1 and following a UV curing step;

FIG. 3 is FTIR graph of the as-deposited film in accordance with Example 1 prior to thermal annealing or UV curing;

FIG. 4 is a FTIR graph of the as-deposited film in accordance with Example 1 after thermal annealing but before UV curing; and FIG. 5 is a FTIR graph of the as-deposited film in accordance with Example 1 after thermal annealing and also after UV curing.

DETAILED DESCRIPTION

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

A flowable dielectric coating can be achieved by using a process similar to that known in the art such as those processes described in U.S. Pat. Nos. 7,888,233, 7,582,555, and 7,915,13981; all of the foregoing hereby incorporated by reference. A substrate to be coated is placed into a deposition chamber. The temperature of the substrate may be controlled to be less than the walls of the chamber. The substrate temperature is held at a temperature below 150° C., preferably at a temperature below 80° C., and most preferably below 60° C. and greater than −30° C. Preferred exemplary substrate temperatures of this invention range from −30° to 0° C., 0° to 20° C., 10° to 30° C., 20° to 40° C., 30° to 60° C., 40° to 80° C., 70° to 150° C. The substrate optionally has features on it of a small size less than 100 μm in width preferably less than 1 μm in width and most preferably less than 0.5 μm in width. The aspect ratio (the depth to width ratio) of the features, if present, is greater than 0.1:1 and preferably greater than 1:1 and most preferably greater than 2:1.

The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

While any suitable cyclic siloxane precursors can be used in accordance with the instant invention, examples of suitable silicon precursors include at least one compound having a structure represented by:

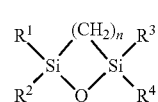

Formula I

Wherein $R^{1-4}$ are independently selected from hydrogen, a linear or branched $C_1$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, and a $C_6$ to $C_{10}$ aryl group; n=1, 2, 3, 4. Preferably $R^{1-4}$ are independently selected from hydrogen and methyl. Exemplary compounds having Formula I include, but not limited to, 2,2,5,5-tetramethyl-1-oxa-2,5-disilacyclopentane, 2,2,6,6-tetramethyl-1-oxa-2,6-disilacyclohexane.

The silicon precursor compounds described herein may be delivered to the reaction chamber such as a plasma enhanced CVD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The deposition can be performed using either direct plasma or remote plasma source. For the remote plasma source, a dual plenum showerhead can be used to prevent premixing between the vapors of the silicon precursors and radicals inside showerhead and thus avoid generating particles. Teflon coating can be executed to maximize the radical lifetime and radical transmission. The remote plasma source can be for example a microwave plasma source.

The silicon precursor compounds are preferably substantially free of halide ions such as chloride or metal ions such as aluminum, iron, nickel, chromium. As used herein, the term "substantially free" as it relates to halide ions (or halides) such as chlorides and fluorides, bromides, iodides, and as it relates to metal ions such as $Al^{3+}$, $Fe^{2+}$, $Fe^{3+}$, $Ni^{2+}$, and $Cr^{3+}$ means less than 10 ppm (by weight), or less than 5 ppm (by weight), preferably less than 3 ppm, and more preferably less than 1 ppm, and most preferably 0 ppm (e.g., greater than about 0 ppm to less than about 1 ppm). Chlorides or metal ions are known to act as decomposition catalysts for silicon precursors. Significant levels of chloride in the final product can cause the silicon precursors to degrade. The gradual degradation of the silicon precursors may directly impact the film deposition process making it difficult for the semiconductor manufacturer to meet film specifications. In addition, the shelf-life or stability is negatively impacted by the higher degradation rate of the silicon precursors thereby making it difficult to guarantee a 1-2 year shelf-life. Moreover, some of silicon precursors are known to form flammable and/or pyrophoric gases upon decomposition such as hydrogen and silane. Therefore, the accelerated decomposition of the silicon precursors presents safety and performance concerns related to the formation of these flammable and/or pyrophoric gaseous byproducts.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodislanes, bromodisilanes, or iododislanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO—Al_2O_3$ blends can be used to remove halides such as chloride.

The method used to form the films or coatings described herein are flowable chemical deposition processes. Examples of suitable deposition processes for the method disclosed herein include, but are not limited to, plasma enhanced chemical vapor deposition.

(PECVD), remote plasma chemical vapor deposition (RPCVD), hot wire chemical vapor deposition (HWCVD) or plasma enhanced cyclic CVD (PECCVD) process. As used herein, the term "flowable chemical vapor deposition processes" refers to any process wherein a substrate is exposed to one or more volatile precursors, which react and/or decompose on the substrate surface to provide flowable oligomeric silicon-containing species and then produce the solid film or material upon further treatment. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the films are deposited using a plasma-based (e.g., remote generated or in situ) CVD process. The term "reactor" as used herein, includes without limitation, a reaction chamber or deposition chamber.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

Energy is applied to the at least one of the compound, nitrogen-containing source, oxygen source, other precursors or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

As previously mentioned, the method deposits a film upon at least a portion of the surface of a substrate comprising a surface feature. The substrate is placed into the reactor and the substrate is maintained at one or more temperatures ranging from about −20° C. to about 100° C. In one particular embodiment, the temperature of the substrate is less than the walls of the chamber. The substrate temperature is held at a temperature below 150° C., preferably at a temperature below 60° C. and most preferably below 40° C. and greater than −20° C.

As previously mentioned, the substrate comprises one or more surface features such as gaps. In one particular embodiment, the surface feature(s) have a width of 100 μm or less, 1 μm in width or less, or 0.5 μm in width. In this or other embodiments, the aspect ratio (the depth to width ratio) of the surface features, if present, is 0.1:1 or greater, or 1:1 or greater, or 10:1 or greater, or 20:1 or greater, or 40:1 or greater. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

In certain embodiments, the reactor is at a pressure below atmospheric pressure or 50 torr or less, or 10 torr or less. In a preferred embodiments, the pressure of the reactor is maintained at a range of about 0.1 torr to about 10 torr. In another embodiment, the pressure of the reactor is maintained at a range of about 10 torr to about 30 torr to provide flowable silicon oxide with less shrinkage upon thermal annealing.

In a general aspect, the present invention is directed to a method and compositions as set forth in the Summary of the Invention above.

In another aspect, there is provided a method for depositing a silicon-containing film, the method comprising:
placing a substrate comprising a surface feature into a reactor wherein the substrate is maintained at one or more temperatures ranging from about −20° C. to about 150° C. and a pressure of the reactor is maintained at 100 torr or less;
introducing at least one compound selected from the group consisting of at least one compound having a structure represented by:

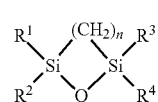

Formula I wherein $R^{1-4}$ are independently selected from hydrogen, a linear or branched $C_1$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, and a $C_6$ to $C_{10}$ aryl group; n=1, 2, 3, 4. Preferably $R^{1-4}$ are independently selected from hydrogen and methyl;
providing an activated oxygen source into the reactor to react with the at least one compound to form a film and cover at least a portion of the surface feature, the oxygen source being activated by, for example, in-situ plasma or remote plasma;
annealing the film at one or more temperatures of about 100° C. to 1000° C., and optionally following this thermal annealing step by exposing the coating to UV radiation for further annealing; and
optionally treating the substrate with an oxygen source at one or more temperatures ranging from about 100° C. to about 1000° C. to form a silicon-containing film on at least a portion of the surface feature. In certain embodiments, the oxygen source is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. In this or other embodiments, the method steps are repeated until the surface features are filled with the silicon-containing film. In embodiments wherein water vapor is employed as an oxygen source, the substrate temperature ranges from about −20° C. to about 40° C. or from about −10° C. to about 25° C.

In another aspect, there is provided a method for depositing a silicon-containing film selected from the group consisting of a silicon nitride, a carbon-doped silicon nitride, a silicon oxynitride, and a carbon-doped silicon oxynitride film, the method comprising:
placing a substrate comprising a surface feature into a reactor which is heated to a temperature ranging from −20° C. to about 150° C. and maintained at a pressure of 100 torr or less;
introducing into the reactor at least one compound selected from the group consisting of at least one compound having a structure represented by:

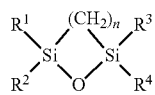

Formula I wherein $R^{1-4}$ are independently selected from hydrogen, a linear or branched $C_1$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, and a $C_6$ to $C_{10}$ aryl group; n=1, 2, 3, 4. Preferably $R^{1-6}$ are independently selected from hydrogen and methyl;
providing a plasma source, either remote or in-situ, to the reactor to react with the compound to form a coating on at least a portion of the surface features. In one particular embodiment, the plasma source that reacts with the compound to form a coating is selected from the group consisting of a nitrogen plasma; plasma comprising nitrogen and helium; a plasma comprising nitrogen and argon; an ammonia plasma; a plasma comprising ammonia and helium; a plasma comprising ammonia and argon; helium plasma; argon plasma; hydrogen plasma; a plasma comprising hydrogen and helium; a plasma comprising hydrogen and argon; a plasma comprising ammonia and hydrogen; an organic amine plasma; and mixtures thereof; and
annealing the coating at one or more temperatures ranging from about 100° C. to 1000° C., or from about 100° to 400° C., to form a silicon-containing film on at least a portion of the surface features. This thermal annealing step may optionally be followed by exposing the coating to UV radiation for further annealing. For flowable plasma enhanced CVD method, the above steps can be repeated until the surface feature are filled with the densified film(s).

The inventive precursors and other related formulations containing one or more of the components comprised therein may be stored, transported and delivered in glass, plastic, or metallic containers or other suitable containers known in the art, such as the containers disclosed in the following U.S.

Pat. Nos. 4,828,131; 6,077,356; 6,526,824; 7,124,913; and 7,261,118, all of which are herein incorporated by reference in their entirety.

Plastic or glass lined metallic vessels or containers may also be used. Preferably, the material is stored and delivered from a hermetically sealed high purity stainless steel or nickel alloy vessel having inert gas in the head space. Most preferably, the material is stored and delivered from a hermetically sealed high purity stainless steel or nickel alloy vessel equipped with a down tube and an outlet in communication with the vapor space of the vessel; allowing the product to be delivered either as a liquid from the downtube or as a vapor from the outlet connection in communication with the vapor phase. In the latter case, the down-tube may be optionally used to introduce a carrier gas into the vessel to promote the vaporization of the mixture. In this embodiment, the downtube and vapor outlet connections are equipped with high integrity packless valves. While delivery of the liquid is preferred to avoid partitioning of the components of this formulation described herein, it should be noted that the formulations of the present invention match the vapor pressure of the components closely enough to enable the formulation to be delivered as a vapor mixture. Stainless steel may preferably be chosen from UNS alloy numbers S31600, S31603, S30400, S30403, S31700, S31703, S31500, S31803, S32750, and S31254. Nickel alloys may preferably be chosen from UNS alloy numbers N06625, N10665, N06022, N10276, and N06007. Most preferably, the vessels are made from alloys S31603 or N06022, either uncoated, internally electro polished or internally coated with a fluoropolymer.

The formulations described herein can be used to provide a rapid and uniform deposition of a flowable silicon oxide film. The formulation described herein may be used with another reactant containing water and optional co-solvents, surfactants and other additives and deposited onto a substrate. Distribution or delivery of this reaction formulation may be achieved by direct liquid injection, spraying, dipping, co-condensation or centrifugal spin-coating. The formulation is then allowed to react until a solid film or body is obtained. The use of inert gas, vacuum, heat or external energy source (light, heat, plasma, e-beam, etc.) to remove unreacted volatile species, including solvents and unreacted water may follow to facilitate the condensation of the film. The formulations of the present invention may preferably be delivered to a substrate contained in a deposition chamber a process fluid such as without limitation, a gas phase, liquid droplets, mist, fog, aerosol, sublimed solid, or combination thereof with water and optionally co-solvents and other additives also added as a process fluid such as a gas, vapor, aerosol, mist, or combination thereof. Preferably, the formulation of the present invention condenses or dissolves into a condensed film on the surface of the substrate, which may advantageously be held at a temperature below that of the walls of the chamber. The co-mixed deposition precursor and catalyst of the present invention can react at a uniform rate on the surface of the substrate rendering the reaction products into a non-volatile film. Unreacted precursors, water and optional co-solvents and additives may then be removed by gas purge, vacuum, heating, addition of external radiation (light, plasma, electron beam, etc.) until a stable solid silicon-containing film is obtained.

Throughout the description, the term "silicon oxide" as used herein refers to a film comprising silicon and oxygen selected from the group consisting of stoichiometric or non-stoichiometric silicon oxide, carbon doped silicon oxide, silicon carboxynitride and there mixture thereof. An example of the silicon containing or silicon nitride film that is formed using the silicon precursors having Formulae I or II and processes described herein has the formulation $Si_xO_yC_zN_vH_w$ wherein Si ranges from about 10% to about 50%; O ranges from about 0% to about 70%; C ranges from about 0% to about 40%; N ranges from about 10% to about 75% or from about 10% to 60%; and H ranges from about 0% to about 10% atomic percent weight % wherein x+y+z+v+w=100 atomic weight percent, as determined for example, by x-ray photoelectron spectroscopy (XPS) or secondary ion mass spectrometry (SIMS).

Throughout the description, the term "features" as used herein refers to a semiconductor substrate or partially fabricated semiconductor substrate having vial, trenches etc.

Certain embodiments of the invention are illustrated by the following Examples. These Examples shall not limit the scope of the appended claims.

EXAMPLES

The flowable chemical vapor deposited (FCVD) films were deposited onto medium resistivity (8-12 Ωcm) single crystal silicon wafer substrates and Si pattern wafers. For the pattern wafers, the preferred pattern width is 20~100 nm with the aspect ratio of 5:1~20:1. The depositions were performed on a modified FCVD chamber on an Applied Materials Precision 5000 system, using a dual plenum showerhead. The chamber was equipped with direct liquid injection (DLI) delivery capability. The precursors were liquids with delivery temperatures dependent on the precursor's boiling point. To deposit the initial flowable silicon oxide films, typical liquid precursor flow rates ranged from about 100 to about 5000 mg/min, preferably 1000 to 2000 mg/min; the chamber pressure ranged from about 0.75-12 Torr, preferably 0.5 to 2 Torr. Particularly, the remote power was provided by MKS microwave generator from 0 to 3000 W with the frequency of 2.455 GHz, operating from 2 to 8 Torr. To densify the as-deposit flowable films, the films were thermally annealed and/or UV cured in vacuum using the modified PECVD chamber at 100~1000° C., preferably 300~400° C. Thickness and refractive index (RI) at 632 nm were measured by a SCI reflectometer or Woollam ellipsometer. The typical film thickness ranged from about 10 to about 2000 nm. Bonding properties hydrogen content (Si—H and C—H) of the silicon-based films were measured and analyzed by a Nicolet transmission Fourier transform infrared spectroscopy (FTIR) tool. X-Ray photoelectron spectroscopy (XPS) analysis were performed to determine the elemental composition of the films. A mercury probe was adopted for the electrical properties measurement including dielectric constant, leakage current and breakdown field. The flowability and gap fill effects on an Al patterned wafer were observed by a cross-sectional Scanning Electron Microscopy (SEM) using a Hitachi S-4800 system at a resolution of 2.0 nm.

2,2,5,5-tetramethyl-2,5-disila-1-oxacyclopentane (TMDSOCH) was used for flowable SiOC film deposition with remote plasma source (RPS). The TMDSOCH flow was 2100 mg/min, oxygen flow was 3000 sccm, pressure was 2.5 Torr. The substrate temperature was 40° C. The microwave power was 2000 W. The as-deposited films were thermally annealed at 300° C. for 5 min and then UV cured at 400° C. for 4 min. The thickness and refractive index of the as-deposited film was 1675.8 nm and 1.431, after the thermal anneal the thickness and refractive index was 1249.9 nm and 1.423 indicating the loss of some volatile oligomers at elevated temperature. The elemental composition of the thermally annealed film as measured by XPS if 30.6% C, 40.0% O and 29.4% Si. The dielectric constant of the film after thermal anneal was 3.50 which we attribute to some moisture absorption due to dangling bonds. After UV cure the thickness and refractive index are 968.3 nm and 1.349 indicating that the film was modified by the UV cure and some porosity was introduced. The elemental composition of the films after thermal anneal and UV curing as measured by XPS if 21.6% C, 45.4% O and 33.0% Si indicating that there is loss of carbon in the film with UV curing. The dielectric constant of the UV cured film was 2.56. Cross-sectional SEM indicated that good gap-fill was achieved on patterned wafers. FIG. 1 and FIG. 2 showed good gap-fill. The films were thermally annealed and UV cured. FIG. 3 shows the FTIR spectra for (a) the as-deposited film, (b) the film after thermal anneal and (c) the film after thermal anneal and UV cure.

While the principles of the invention have been described above in connection with preferred embodiments, it is to be clearly understood that this description is made only by way of example and not as a limitation of the scope of the invention.

The invention claimed is:

1. A flowable chemical vapor deposition method for forming a silicon containing film upon a substrate, the method comprising:
   placing the substrate into a reaction chamber and introducing a cyclic siloxane composition comprising 2,2,5,5-tetramethyl-2,5-disila-1-oxacyclopentane and at least one activated species into the reaction chamber;
   wherein the reaction chamber conditions are controlled so the cyclic siloxane composition comprising 2,2,5,5-tetramethyl-2,5-disila-1-oxacyclopentane and the activated species are made to react and condense onto the substrate as a flowable film, and wherein the at least one activated species is remotely activated with respect to the reaction chamber;
   wherein the cyclic siloxane composition comprising 2,2,5,5-tetramethyl-2,5-disila-1-oxacyclopentane comprises less than less than 10 ppm chlorine, fluorine, bromine, and iodide ions in total;
   wherein the cyclic siloxane composition comprising 2,2,5,5-tetramethyl-2,5-disila-1-oxacyclopentane comprises less than 10 ppm of Al3+, Fe2+, Fe3+, Ni2+, and Cr3+ metal ions in total;
   wherein the substrate comprises surface features having gaps therebetween, and wherein the silicon-containing compound and the activated species react to form the flowable film within the gaps; and
   treating the flowable film to convert the flowable film to a dielectric material;
   wherein treating the flowable film comprises a thermal annealing step followed by a UV curing step; and
   wherein the at least one activated species is an oxidant selected from the group consisting of water vapor, ozone, oxygen, oxygen/helium, oxygen/argon, nitrogen oxides, carbon dioxide, hydrogen peroxide, organic peroxides, and mixtures thereof.

2. The method according to claim 1, wherein the gaps have depth to width aspect ratios ranging from 3:1 to 10:1.

3. The method of claim 1, wherein the activated species is generated using a remote plasma source, a remote microwave source, or a remote hot-wire system.

4. The method according to claim 1, wherein the at least one activated species is an oxidant generated by action of a plasma source or a remote microwave source upon a species selected from the group consisting of water vapor, ozone, oxygen, oxygen/helium, oxygen/argon, nitrogen oxides, carbon dioxide, hydrogen peroxide, organic peroxides, and mixtures thereof.

5. The method according to claim 1, wherein the at least one activated species is generated by action of a plasma source or a remote microwave source upon a species selected from nitrogen, a mixture of nitrogen and helium, a mixture of nitrogen and argon, ammonia; a mixture of ammonia and helium, a mixture of ammonia and argon, helium, argon; hydrogen, a mixture of hydrogen and helium, a mixture of hydrogen and argon, a mixture of ammonia and hydrogen, organic amine, and mixtures thereof.

6. The method according to claim 1, wherein the cyclic siloxane composition comprising 2,2,5,5-tetramethyl-2,5-disila-1-oxacyclopentane comprises less than less than 1 ppm chlorine, fluorine, bromine, and iodide ions.

7. The method according to claim 1, wherein the cyclic siloxane composition comprising 2,2,5,5-tetramethyl-2,5-disila-1-oxacyclopentane comprises less than less than 1 ppm Al3+, Fe2+, Fe3+, Ni2+, and Cr3+ metal ions.

8. The method of claim 1, wherein the dielectric material has a dielectric constant of less than 3.50.

9. The method of claim 1, wherein the dielectric material has a refractive index of less than 1.423.

10. The method of claim 1, wherein the thermal annealing step is conducted at a first temperature and the UV curing step is conducted a second temperature, and wherein the second temperature is greater than the first temperature.

* * * * *